United States Patent [19]

Egawa

[11] Patent Number: 5,606,203
[45] Date of Patent: Feb. 25, 1997

[54] SEMICONDUCTOR DEVICE HAVING AL-CU WIRING LINES WHERE CU CONCENTRATION IS RELATED TO LINE WIDTH

[75] Inventor: Hidemitsu Egawa, Tokyo, Japan

[73] Assignee: Kabushiki Kaisha Toshiba, Kawasaki, Japan

[21] Appl. No.: 481,160

[22] Filed: Jun. 7, 1995

Related U.S. Application Data

[63] Continuation-in-part of Ser. No. 295,037, Aug. 25, 1994, abandoned, which is a continuation of Ser. No. 142,955, Oct. 29, 1993, abandoned.

[30] Foreign Application Priority Data

Jan. 20, 1993 [JP] Japan ............................ 5-007505

[51] Int. Cl.$^6$ ........................................ H01L 23/48
[52] U.S. Cl. .................... 257/771; 257/767; 257/762
[58] Field of Search ........................ 257/767, 762, 257/765, 771, 740

[56] References Cited

U.S. PATENT DOCUMENTS

| | | | |
|---|---|---|---|
| 3,716,469 | 2/1973 | Bhatt et al. ............................ | 257/762 |
| 3,743,894 | 7/1973 | Hall et al. ............................. | 257/767 |
| 4,352,239 | 10/1982 | Pierce ................................... | 257/767 |
| 4,438,450 | 3/1984 | Sheng et al. ......................... | 257/771 |
| 4,924,290 | 5/1990 | Enkaku et al. ....................... | 257/758 |
| 5,071,714 | 12/1991 | Rodbell et al. ...................... | 257/767 |
| 5,300,307 | 4/1994 | Frear et al. .......................... | 427/96 |

FOREIGN PATENT DOCUMENTS

| | | |
|---|---|---|
| 0307272 | 3/1989 | European Pat. Off. . |
| 60-254636 | 12/1985 | Japan . |
| 62-114241 | 10/1987 | Japan . |
| 02-084719 | 3/1990 | Japan . |

OTHER PUBLICATIONS

Scoggan et al., "Width Dependence of Electromigration Life in Al–Cu, Al–Cu–Si and Ag Conductors," Reliability Physics, Apr. 1975, pp. 51–158.

Kwok, "Effect of Grain Growth and Grain Structure on Electromigration Lifetime in Al–Cu Submicron Interconects," Proc. of Fourth Int'l. IEEE VLSI Mutilevel Interconnection Conference, Jun. 1987, pp. 456–462.

Primary Examiner—Jerome Jackson, Jr.
Assistant Examiner—Nathan K. Kelley
Attorney, Agent, or Firm—Finnegan, Henderson, Farabow, Garrett & Dunner, L.L.P.

[57] ABSTRACT

A semiconductor device that includes a wiring line formed from an electrode wiring layer which uses, as an electrode material, an Al alloy containing Cu, wherein wiring line having a size smaller than a crystal grain diameter has a Cu concentration of 0.05 to 0.3 wt %, and a wiring line having a size larger than a crystal grain diameter has a Cu concentration of 0.5 to 10 wt %.

2 Claims, 2 Drawing Sheets

SEMICONDUCTOR DEVICE HAVING AL-CU WIRING LINES WHERE CU CONCENTRATION IS RELATED TO LINE WIDTH

This application is a continuation-in-part of application Ser. No. 08/295,037 filed Aug. 25, 1994, now abandoned, which is a continuation of application Ser. No. 08/142,955 filed Oct. 29, 1993, abandoned.

BACKGROUND OF THE INVENTION

1. Field of the Invention

Aluminum is generally used for an electrode wiring line of a semiconductor device in view of a resistance or workability. For the Al wiring line, a Cu-added Al alloy is generally used to prevent occurrence of an erroneous wiring line mode such as electro-migration or stress-migration, thereby improving reliability.

2. Description of the Related Art

The Al wiring line having a size of several μm larger than the size of Al crystal generally has a point where three grain boundaries between the Al grains overlap, i.e., a triple point of the grain boundaries.

If a large current having, e.g., a current density of $10^4$ A/cm$^2$ or more flows in the wiring line, Al atoms start to diffuse along the grain boundaries, so that the atoms are excess or deficient at the triple points of the grain boundaries to cause disconnection.

This phenomenon is called electro-migration. This is caused because the activation energy of the grain boundary of the Al-Cu alloy is about 1.4 eV while the activation energy of the grain boundary is about 0.6 eV, so that the grain boundary serves as a high-speed diffusion path.

Cu is added to the Al alloy to segregate Cu at the grain boundaries and prevent the Al atoms from diffusing along the grain boundaries. As shown in FIG. 1, the electromigration life MTF [arb.unit] is prolonged depending on the content of Cu when the Cu concentration is about 8 wt % or less.

In a submicron region in which the wiring line size is 1 μm or less and smaller than the crystal grain diameter, for example, as shown in FIG. 2, the above-described triple points disappear in the wiring line, leaving bamboo-node-like grain boundaries across the grain diameter boundaries. More specifically, as the wiring line size becomes larger, the number of triple points of the grain boundaries per unit length is increased, as indicated by a line L2, so that electro-migration tends to occur. On the other hand, as the wiring line size becomes smaller, the number of bamboo-node-like grain boundaries is increased, as indicated by a line L1. The electro-migration life at this time depends on the diffusion speed within the crystal grain, MTF is improved as a whole, and the wiring line life tends to be prolonged. The line L1 represents the number of bamboo-node-like grain boundaries per unit length with respect to the line size, and the line L2 represents the number of triple points of the grain boundaries per unit with respect to the line size.

In the wiring line having a size smaller than the grain diameter, as shown in FIG. 3, MTF is improved when the Cu concentration is about 0.1 wt % or less. If the Cu concentration exceeds 0.1 wt %, MTF is degraded.

That is because Cu is segregated at the grain boundaries when Cu is added exceeding the limit amount for dissolving Cu into Al crystal, and the diffusion speed in the longitudinal direction of the wiring line varies at the grain boundaries where Cu is segregated to cause disconnection.

However, the Cu concentration of the current wiring line is determined by the Cu concentration of a spattering target or vapor source, so that all the electrode wiring lines formed in the same process have the same Cu concentration. For this reason, the electrode wiring lines having the same Cu concentration are used although each electrode wiring line ranging from a wiring line having a size in the submicron region to be used as a signal line to a wiring line having a size of 10 μm or more to be used as a power line has an optimal Cu concentration for its size. Thus, an optimal resistance to electro-migration for wiring lines having different sizes cannot be obtained.

SUMMARY OF THE INVENTION

The present invention has been made to overcome the above drawback, and has as its object to provide a semiconductor device which selects and defines the Cu concentration of the electrode consisting of an Al alloy in accordance with the wiring line size, thereby obtaining an optimal resistance to electro-migration and high reliability.

In order to achieve the above object, according to the present invention, there is provided a semiconductor device comprising a wiring line formed from an electrode wiring layer using, as an electrode material, an Al alloy containing Cu, wherein a wiring line having a size smaller than a crystal grain diameter has a Cu concentration of 0.05 to less than 0.5 wt %, and a wiring line having a size larger than a crystal grain diameter has a Cu concentration of 0.5 to 10 wt %.

with the above arrangement, the semiconductor of the present invention selects and defines the Cu concentration in the Al alloy wiring line in accordance with the wiring line size, thereby obtaining an optimal resistance to electro-migration.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Preferred embodiments of the present invention include the following:

One preferred embodiment is a semiconductor device comprising a wiring line formed from an electrode wiring layer using, as an electrode material, an Al alloy containing Cu. The wiring line has a width of a cross section smaller than an average crystal grain diameter of the electrode material and has a Cu concentration in percent by weight that prevents Cu from being segregated during annealing of the electrode material.

A second preferred embodiment is a semiconductor device comprising wiring lines formed from an electrode wiring layer using, as an electrode material, an Al alloy containing Cu. The wiring lines comprise a first wiring line having a width of a cross section smaller than an average crystal grain diameter of the electrode material and a second wiring line having a width of a cross section larger than the average crystal grain diameter. The first wiring line has a Cu concentration in percent by weight that prevents Cu from being segregated during annealing of the the electrode material, and the second wiring line has a Cu concentration in percent by weight that permits Cu to be segregated during annealing of the electrode material.

A third preferred embodiment is a semiconductor device comprising a wiring line formed from an electrode wiring layer using, as an electrode material, an A alloy containing Cu. The wiring line has a width of a cross section smaller than an average crystal grain diameter of the electrode material and has a Cu concentration of less than 0.5 percent by weight that prevents Cu from being segregated during annealing of the electrode material to provide a Cu concentration that results in optimum resistance to electromigration.

A fourth preferred embodiment is a semiconductor device comprising wiring lines formed from an electrode wiring layer using, as an electrode material, an Al alloy containing Cu. The wiring lines comprise a first wiring line having a width of a cross section smaller than an average crystal grain diameter of the electrode material and a second wiring line having a width of a cross section larger than the average crystal grain diameter. The first wiring line has a Cu concentration of less than 0.5 percent by weight that prevents Cu from being segregated during annealing of the electrode material to provide a Cu concentration that results in optimum resistance to electromigration, and the second wiring line has a Cu concentration of 0.5 or more in percent by weight that permits Cu to be segregated during annealing of the electrode material.

A semiconductor device according to an embodiment of the present invention will be described below with reference to the accompanying drawings.

FIGS. 4 to 8 are views showing steps of manufacturing a semiconductor device according to an embodiment of the present invention.

Figure 4:
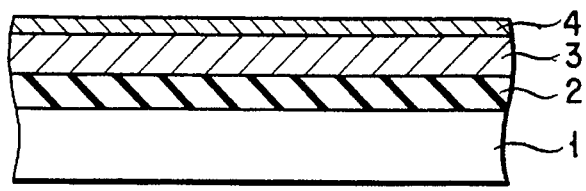
FIG. 4 is a partial sectional view showing a step of manufacturing the semiconductor device of the present invention.

As shown in FIG. 4, an Al-Cu alloy 3 serving as an electrode wiring line is formed on the surface of a semiconductor substrate 1 through an insulating film 2. A Cu-based material 4, e.g., pure Cu is formed on the Al-Cu alloy 3. Although film formation is performed by the sputtering method, the deposition method can be used in place of the sputtering method.

Figure 5:
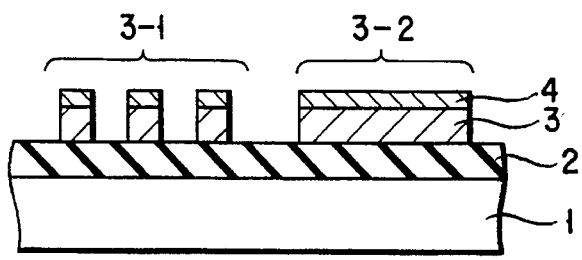
FIG. 5 is a partial sectional view showing a step of manufacturing the semiconductor device of the present invention following the step shown in FIG. 4.

As shown in FIG. 5, the resultant structure constituted by stacking the Al-Cu alloy 3 and the Cu-based material 4 is formed into electrode wiring lines 3-1 and 3-2. More specifically, the wiring line 3-1 having a diameter smaller than the crystal grain size of the Al-Cu alloy 3 and the wiring line 3-2 having a size larger than the crystal grain diameter of the Al-Cu alloy 3 are formed to selectively expose the insulating film 2.

Figure 6:
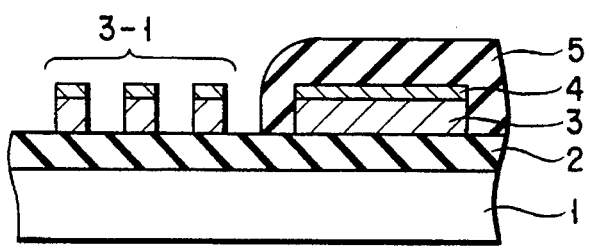
FIG. 6 is a partial sectional view showing a step of manufacturing the semiconductor device of the present invention following the step shown in FIG. 5.
Figure 7:
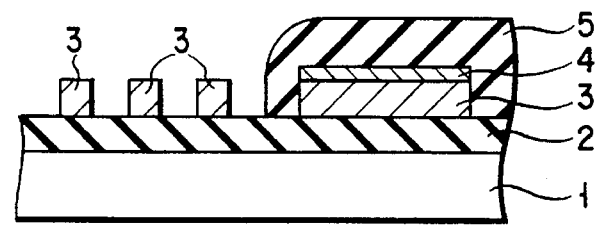
FIG. 7 is a partial sectional view showing a step of manufacturing the semiconductor device of the present invention following the step shown in FIG. 6.

As shown in FIG. 6, a resist 5 is covered on a part of the exposed portion of the insulating film 2, and the Cu-based material 4. As shown in FIG. 7, the Cu-based material 4 of the wiring line 3-1 having a size smaller than the crystal grain diameter of the Al-Cu alloy 3 is selectively removed by exposure and development to expose the thin wiring line 3-1.

On the other hand, the resist 5 is covered on the thick wiring line 3-2.

Figure 8:
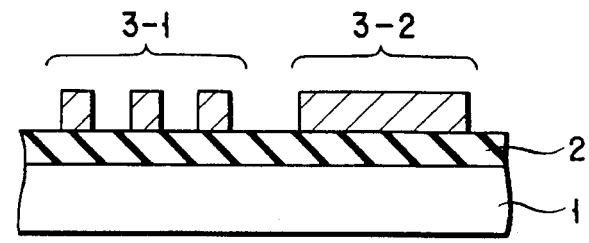
FIG. 8 is a partial sectional view showing a step of manufacturing the semiconductor device of the present invention following the step shown in FIG. 7.

As shown in FIG. 8, after the resist 5 covered on the thick wiring line 3-2 is removed, annealing is performed, e.g., in a reducing atmosphere. As a result, the Cu-based material 4 of the thick wiring line 3-2 is diffused by using the grain boundaries in the Al-Cu alloy 3 as the main diffusion path to increase the Cu concentration in the Al-Cu alloy 3 of the thick wiring line 3-2. The thick wiring line 3-2 shown in FIG. 8 has a higher Cu concentration than that of the thin wiring line 3-1 by a diffusion amount.

Figure 1:
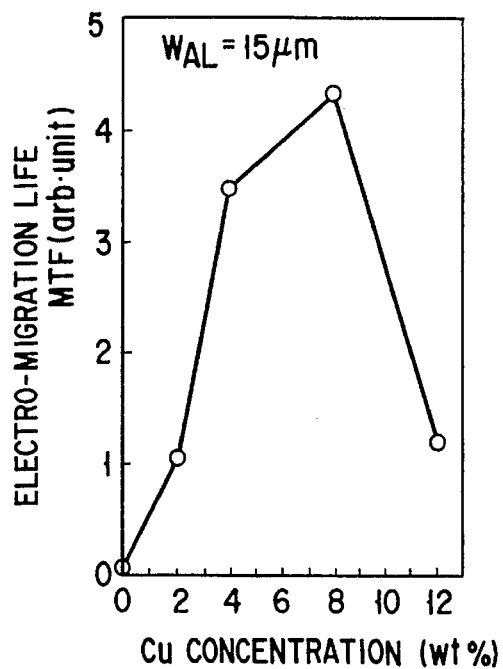
FIG. 1 is a graph showing the Cu concentration dependency of a resistance to electro-migration when an Al-Cu alloy wiring line has a width of 15 μm.
Figure 3:
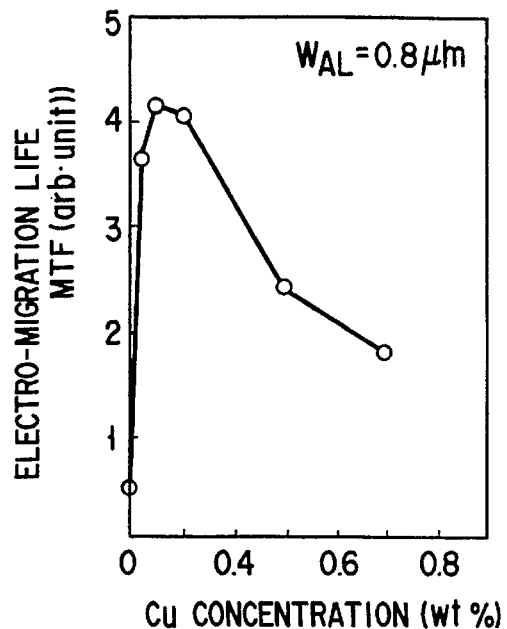
FIG. 3 is a graph showing the Cu concentration dependency of a resistance to electro-migration when an Al-Cu alloy wiring line has a width of 0.8 μm.
Figure 2:
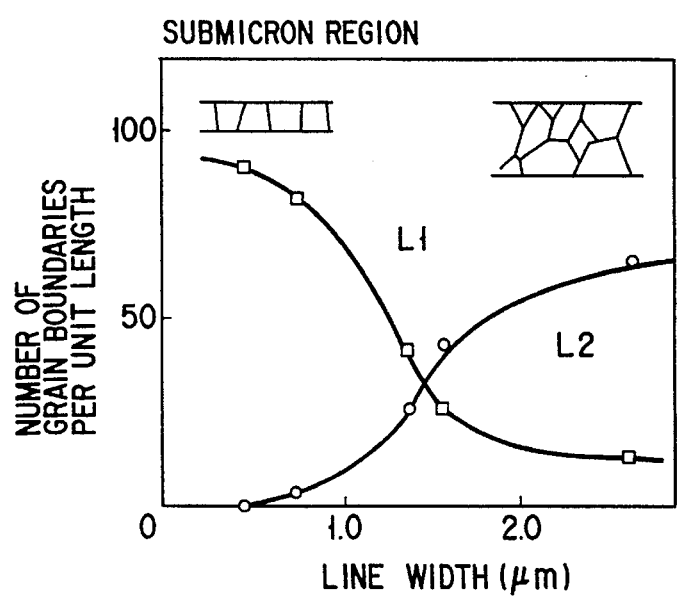
FIG. 2 is a view showing an example of a grain shape in the Al alloy wiring line.

If the Cu concentration of the Al-Cu alloy 3 in this embodiment is set in advance to be equal to that of the final wiring line 3-1 having a size smaller than the crystal grain diameter, the resistance to electro-migration of the wiring line 3-1 having a size smaller than the crystal grain diameter can be maximized, as shown in FIG. 3.

In this case, Cu must not be segregated in the Al-Cu alloy 3 of the thin wiring line 3-1. Checking the segregated state of Cu, Cu was not segregated by annealing when the Cu concentration was less than 0.5 wt %.

In the final product, the Cu concentration of the Al alloy wiring line having a size smaller than the crystal grain diameter was in a range of 0.05 to less than 0.5 wt %. Also in the Al-Cu alloy 3 of this embodiment, an optimal resistance to migration was obtained in a range of 0.05 to less than 0.5 wt % of the Cu concentration.

In the above embodiment, the Cu-based material 4 is first covered on the Al-Cu alloy 3, and then the resultant structure is formed into the electrode wiring lines. However, the Al-Cu alloy 3 may be first formed into a desired electrode wiring line shape, and the Cu-based material 4 may be then covered and diffused.

As has been described with reference to FIGS. 7 and 8, the Cu-based material is preferably annealed in the reducing atmosphere. However, annealing may be performed in an inert gas atmosphere as of N2 and Ar.

If annealing was performed in the reducing atmosphere, a Cu oxide film was found to be used as the Cu-based material.

In the above embodiment, the wiring line 3-2 having a diameter larger than the crystal grain size can obtain an optimal resistance to electro-migration at the Cu concentration of about 8 wt %. On the other hand, Cu must be segregated at the triple points where the grain boundaries in the Al-Cu alloy 3 overlap. It was confirmed that segregation was caused at the Cu concentration of 0.5 wt % or more by annealing.

The Cu concentration of 8 wt % or more only causes degradation of the resistance to electro-migration. Therefore, the optimal range of the Cu concentration of the wiring line 3-2 having a size larger than the crystal grain diameter is defined as 0.5 to 10 wt %.

The final Cu concentration of the thick wiring line 3-2 can be set by defining the thickness of the Cu-based material 4 on the basis of the Cu concentration and the thickness of the Al-Cu alloy 3 such that a desired concentration is obtained.

For example, 800-Å pure Cu is covered on a 1-μm thick Al-0.1 wt % Cu alloy, and the manufacturing process in FIGS. 4 and 5 is performed to obtain a thin wiring line 3-1 having a Cu concentration of 0.1 wt %, and a thick wiring line 3-2 having a Cu concentration of 8 wt %, thereby obtaining an optimal resistance to electromigration.

Although the Al-Cu alloy is exemplified as the electrode wiring line, other additive elements containing, e.g., Si may be used to obtain the same effect as described above.

The term "crystal grain diameter," as used herein, is the diameter of a circle having the same area as the projected area of a crystal grain surrounded by the grain boundaries.

The term "average crystal grain diameter" is the average of the crystal grain diameters of given crystal grains the number of which is fifty or more, for example one hundred, with the average being represented in logarithmic terms.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device comprising:

wiring lines formed from an electrode wiring layer using, as an electrode material, an Al alloy containing Cu, said wiring lines comprising a first wiring line having a width of a cross section smaller than an average crystal grain diameter of said electrode material and a second wiring line having a width of a cross section larger than the average crystal grain diameter;

wherein said first wiring line has a Cu concentration in percent by weight that prevents Cu from being segregated during annealing of said electrode material, and said second wiring line has a Cu concentration in percent by weight that permits Cu to be segregated during annealing of said electrode material.

2. A semiconductor device comprising:

wiring lines formed from an electrode wiring layer using, as an electrode material, an Al alloy containing Cu, said wiring lines comprising a first wiring line having a width of a cross section smaller than an average crystal grain diameter of said electrode material and a second wiring line having a width of a cross section larger than the average crystal grain diameter;

wherein said first wiring line has a Cu concentration of less than 0.5 percent by weight that prevents Cu from being segregated during annealing of said electrode material to provide a Cu concentration that results in optimum resistance to electromigration, and said second wiring line has a Cu concentration of 0.5 or more in percent by weight that permits Cu to be segregated during annealing of said electrode material.

* * * * *